(12) United States Patent
Xin et al.

(10) Patent No.: US 8,489,225 B2
(45) Date of Patent: Jul. 16, 2013

(54) WAFER ALIGNMENT SYSTEM WITH OPTICAL COHERENCE TOMOGRAPHY

(75) Inventors: Yongchun Xin, Hopewell Junction, NY (US); Xu Ouyang, Hopewell Junction, NY (US); Yunsheng Song, Hopewell Junction, NY (US); Tso-Hui Ting, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 13/042,494

(22) Filed: Mar. 8, 2011

(65) Prior Publication Data

US 2012/0232686 A1 Sep. 13, 2012

(51) Int. Cl.
*G06F 19/00* (2011.01)
*G05B 19/18* (2006.01)
*G01N 21/00* (2006.01)
*G01B 11/02* (2006.01)

(52) U.S. Cl.
USPC ........... 700/192; 700/57; 700/58; 700/59; 700/114; 700/193; 356/237.3; 356/237.4; 356/508; 356/509

(58) Field of Classification Search
USPC ............ 700/57–59, 108–109, 114, 192–195; 356/237.2–237.5, 508–509; 414/936
See application file for complete search history.

(56) References Cited

U.S. PATENT DOCUMENTS

| | | | |
|---|---|---|---|
| 6,198,535 B1 * | 3/2001 | Hu et al. | 356/401 |
| 6,480,285 B1 * | 11/2002 | Hill | 356/492 |
| 7,371,663 B2 * | 5/2008 | Chen et al. | 438/460 |
| 7,442,476 B2 | 10/2008 | Best et al. | |
| 7,826,064 B2 * | 11/2010 | de Groot et al. | 356/508 |
| 8,232,659 B2 * | 7/2012 | Chen et al. | 257/797 |
| 2003/0081213 A1 | 5/2003 | Oishi et al. | |
| 2004/0239942 A1 | 12/2004 | Sun | |
| 2005/0185183 A1 * | 8/2005 | Ban | 356/401 |
| 2005/0265403 A1 * | 12/2005 | Anderson et al. | 372/20 |
| 2008/0157407 A1 * | 7/2008 | Chen et al. | 257/797 |
| 2009/0021724 A1 | 1/2009 | Mahadevan-Jansen et al. | |
| 2009/0252580 A1 * | 10/2009 | Takizawa et al. | 414/222.02 |
| 2009/0299679 A1 * | 12/2009 | Desineni et al. | 702/119 |

(Continued)

FOREIGN PATENT DOCUMENTS

| | | |
|---|---|---|
| JP | 61275609 | 12/1986 |
| KR | 100771362 | 10/2007 |
| WO | 2007120420 | 10/2007 |

OTHER PUBLICATIONS

Notification of Transmittal of the International Search Report and the Written Opinion of the International Searching Authority, or the Written Declaration, from KIPO, dated Sep. 26, 2012, Prepared by: Kim Jin Sung.

(Continued)

*Primary Examiner* — Ramesh Patel
(74) *Attorney, Agent, or Firm* — Howard M. Cohn; Ian D. MacKinnon

(57) ABSTRACT

A system for performing alignment of two wafers is disclosed. The system comprises an optical coherence tomography system and a wafer alignment system. The wafer alignment system is configured and disposed to control the relative position of a first wafer and a second wafer. The optical coherence tomography system is configured and disposed to compute coordinate data for a plurality of alignment marks on the first wafer and second wafer, and send that coordinate data to the wafer alignment system.

20 Claims, 7 Drawing Sheets

U.S. PATENT DOCUMENTS

| | | | |
|---|---|---|---|
| 2010/0080446 A1* | 4/2010 | Herschbein et al. | 382/149 |
| 2010/0214550 A1* | 8/2010 | Hulsebos et al. | 355/74 |
| 2010/0220334 A1 | 9/2010 | Condit et al. | |
| 2011/0176139 A1* | 7/2011 | Yamaguchi et al. | 356/456 |

OTHER PUBLICATIONS

M. Sergeeva et al.; Sub Surface Damage Measurements Based on Short Coherent Interferometry; Journal of the European Optical Society; Rapid Publications 5, 10003; 2010.

Jon Holmes; Micro/Nano Lithography, Novel Optical-Signal Acquisition Method Addresses Grand Challenges for Silicon Technology; SPIE Newsroom; Jan. 7, 2009.

Rainer Engelke et al.; Investigations on Possibilities of Inline Inspection of High Aspect Ratio Microstructures Microsyst. Technol.; 2007; pp. 319-325.

Taekmin Kwon et al.; Optical Coherence Tomography of Silicon Wafers Using a Femtosecond Pulse Laser; Asian Symposium for Precision Engineering and Nanotechnology; 2007.

* cited by examiner

WAFER ALIGNMENT SYSTEM WITH OPTICAL COHERENCE TOMOGRAPHY

FIELD OF THE INVENTION

The present invention relates a method for three dimensional alignment in wafer scale integration and a system for three dimensional alignment in wafer scale integration.

BACKGROUND OF THE INVENTION

Wafer bonding is a technology used in micro-electronics fabrication, in which a first substrate carrying first devices on its surface is aligned with second devices on a surface of a second substrate for fabricating an electronic circuit. Typically, the contact is arranged in such a way that signals can be transported from at least one first device on the first substrate to at least one second device on the second substrate and vice versa. This arrangement is often referred to as a 3D wafer alignment.

Prior art systems for accomplishing such an alignment have employed optical methods, where a small hole is formed in each wafer, and a light source is used to align the holes, by passing light through holes in both wafers. However, sub-micron precision is difficult to achieve due to optical diffraction. That is, in an effort to increase precision, the holes are made smaller, but the smaller holes increase the effects of optical diffraction, making the alignment more error-prone. Furthermore, these systems require many optical sensors and a complex feedback system to control wafer position in the X, Y, and Z directions. As semiconductor technology continues the trend of miniaturization, it becomes increasingly important to achieve high-precision wafer alignment. Therefore, it is desirable to have a wafer alignment system with improved precision.

SUMMARY

In one embodiment a system for performing alignment of two wafers includes an optical coherence tomography system and a wafer alignment system.

The wafer alignment system is configured and disposed to control the relative position of a first (or upper) wafer and a second (or lower) wafer. The optical coherence tomography system is configured and disposed to compute coordinate data for a plurality of alignment marks on the first wafer and second wafer, and send that coordinate data to the wafer alignment system.

In another embodiment, a system is provided for performing alignment of two wafers. The system includes: a light source configured to emit light having a wavelength ranging between 1.1 micrometers and 1.6 micrometers; a collimating lens configured and disposed to collimate light from the light source; a beam splitter configured and disposed to split the light from the collimating lens into a reference path and a target path; an objective lens configured and disposed to focus light of the target path onto a set of wafers comprising a first wafer and a second wafer; and a detector configured and disposed to receive light from the reference path and the target path. A computer system is configured and disposed to compute a three-dimensional tomogram of the set of wafers and compute correction data; and a wafer stage control is configured and disposed to receive correction data from the computer system and adjust the relative position of the first wafer and second wafer in response to the correction data.

In another embodiment, a method is provided for performing alignment of two wafers, The method includes: obtaining a three-dimensional tomogram of the two wafers; computing alignment correction data; sending the alignment correction data to a wafer stage control; and adjusting the relative position of the two wafers with the wafer stage control in response to receiving the alignment data.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 is a block diagram of an embodiment of the present invention.

FIG. 2 is a block diagram of an embodiment of the present invention showing additional details.

FIG. 3 shows a top-down view of alignment marks in accordance with an embodiment of the present invention.

FIG. 3B shows a side view of alignment marks in accordance with an embodiment of the present invention.

FIG. 3C shows a top-down view of the alignment marks of FIG. 3B.

FIG. 3D is a top down view of two wafers, indicating correction data.

FIG. 4 shows a top-down view of alignment marks in accordance with another embodiment of the present invention.

FIG. 5 shows alignment marks on wafers having warpage.

FIG. 5B shows an additional embodiment utilizing a best-fit plane.

FIG. 6 shows a top-down view of multiple alignment marks on a wafer.

FIG. 7 is a flowchart indicating process steps for an embodiment of the present invention.

DETAILED DESCRIPTION

Embodiments of the present invention utilize optical coherence tomography (OCT) for identifying the coordinates of alignment marks in the X, Y, and Z dimensions. OCT is an optical signal acquisition and processing method. The principle behind OCT is to compare the phase difference between a target signal (which illuminates the subject to be inspected) and a reference signal (which does not illuminate or pass through the subject to be inspected). The phase difference information is then used to derive information about the subject, including depth (Z direction). The OCT technique has been used for generating 3D images of biological samples in the field of medicine. Embodiments of the present invention adapt OCT for use in a semiconductor fabrication application.

Figure 1:
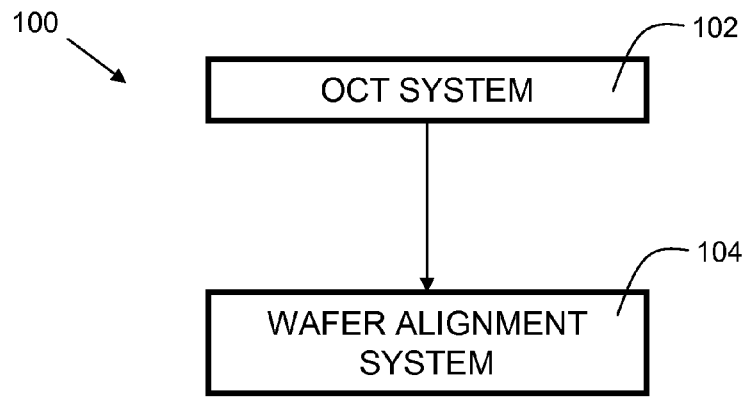

FIG. 1 is a block diagram 100 of an embodiment of the present invention. OCT system 102 computes X, Y, and Z coordinates of multiple wafer alignment marks and provides information to wafer alignment system 104, which makes the necessary adjustments to wafer position to align wafers in a 3D integration scheme.

Figure 2:
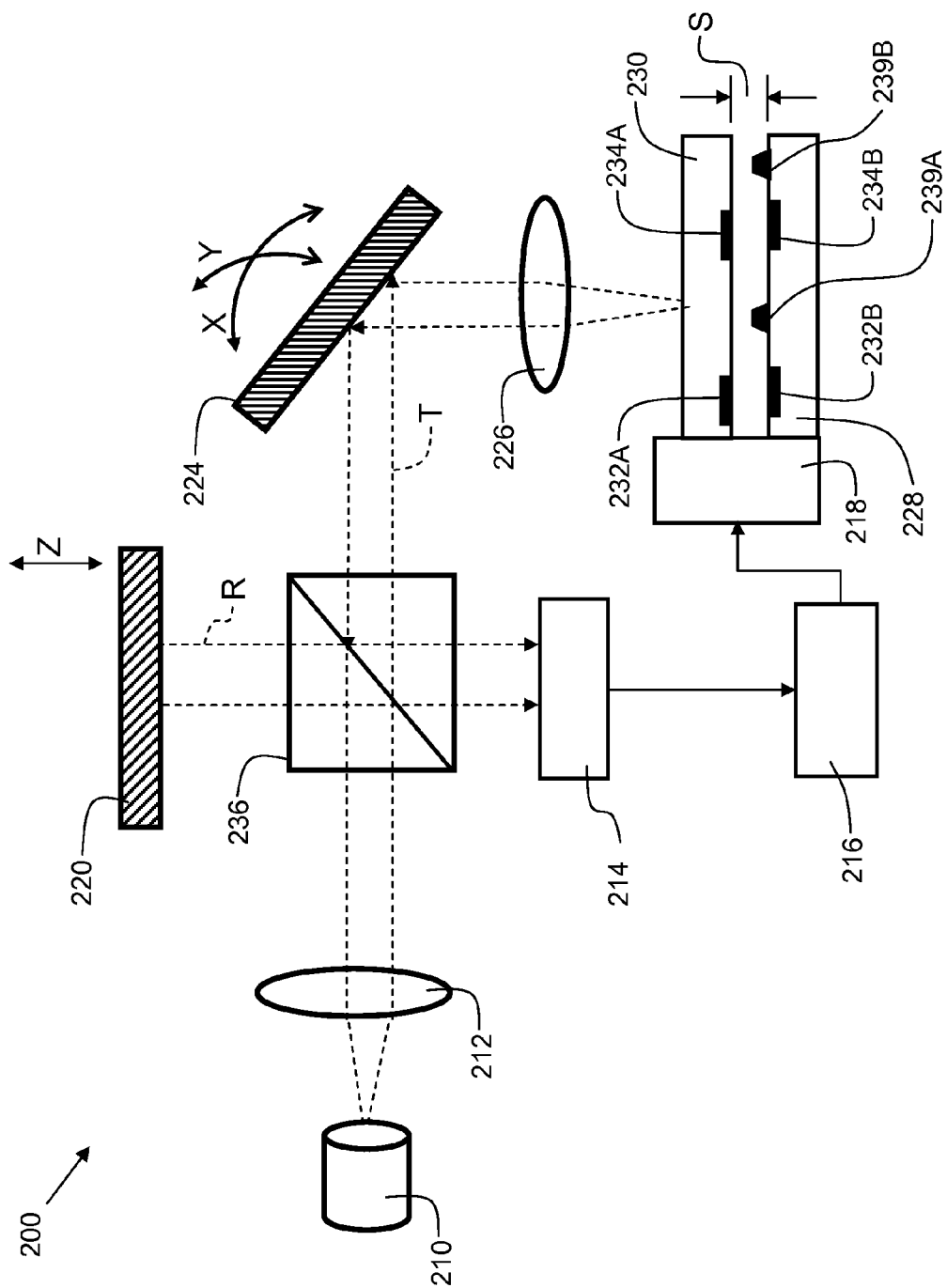

FIG. 2 is a block diagram 200 of an embodiment of the present invention showing additional details. Light source 210 is preferably a low coherence light source. Unlike medical applications, the wavelength of light emitted from light source 210 is preferably in the range of 1.1-1.7 micrometers, and more preferably about 1.2 micrometers. This wavelength range (IR range) is better suited for identifying alignment marks within silicon wafers. Collimation lens 212 collimates the light source, and the collimated light then illuminates beam splitter 236. Beam splitter 236 splits the collimated light into a target path T and a reference path R. The target path light proceeds to X/Y mirror 224, and then through objective lens 226 which focuses the light on the "target," which is the two wafers. The wavelength of light used can pass through the silicon of upper wafer 230 and lower wafer 228. Note that while FIG. 2 shows wafers 230 and 228 oriented as an upper wafer and a lower wafer, other embodiments may have the wafers in a different orientation (e.g. side-by-side).

X/Y mirror 224 is moveable as indicated by X/Y arrows, and its movement determines area of the wafers where the focused light illuminates it. The relative positions of upper wafer 230 and lower wafer 228 are controlled by wafer stage control 218. Wafer stage control 218 typically comprises platens or chucks controlled by stepper motors or servos with position encoders to precisely control the relative position of the upper and lower wafers.

The upper and lower wafers are maintained at a distance S apart from each other. It is desirable for the wafers not to contact each other, as that could cause damage to the wafers. In one embodiment, the distance S is in the range of 40 to 60 micrometers. This provides a safe distance for the two wafers. Some bonding material 239A, 239B may be applied to one of the wafers prior to alignment. Once the wafers are aligned, the upper wafer is lowered onto the lower wafer and contacts bonding material, to bond upper wafer 230 and lower wafer 228 together.

Upper wafer 230 and lower wafer 228 have a plurality of corresponding alignment marks. Upper wafer 230 comprises alignment marks 232A and 234A. Lower wafer 228 comprises alignment marks 232B and 234B. The wafers are aligned when mark 232A is directly over mark 232B and mark 234A is directly over mark 234B.

Z mirror 220 is moveable in the Z direction (indicated by arrow Z). It reflects the reference signal R from beam splitter 236, back through the beam splitter, and into detector 214. Hence detector 214 receives both the reference signal R and the target signal T. The signals from detector 214 are input to computer system 216 which computes alignment correction data by comparing the location of alignment marks on the upper wafer 230 with corresponding alignment marks on the lower wafer 228. The difference in the X and Y dimensions between the corresponding marks is then computed and sent to wafer stage control 218.

Adjustment of the Z mirror changes the length of the path of reference signal R, which alters the phase of the reference signal. OCT exploits the changing phase, and phase difference between reference signal R and target signal T to derive depth information, in addition to X and Y coordinate information. Hence, the alignment can be performed without the disadvantages of optical diffraction.

Figure 3:
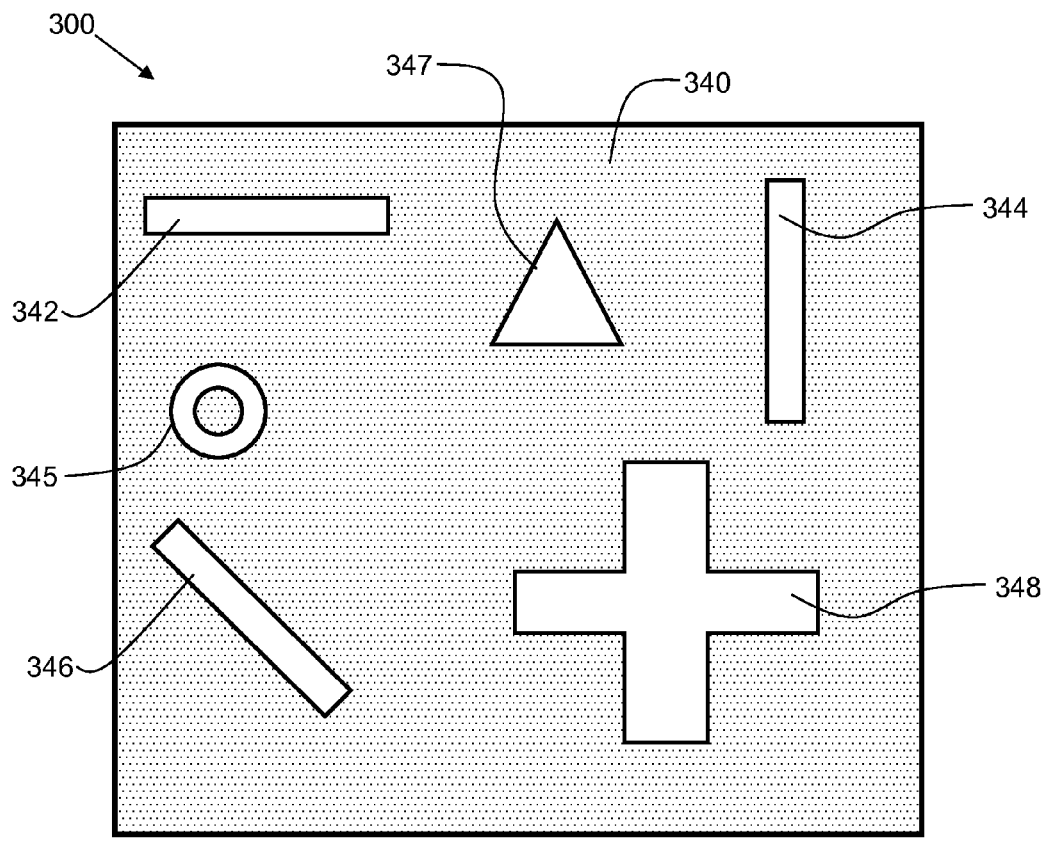

FIG. 3 shows a top-down view of alignment marks in accordance with an embodiment of the present invention. Alignment mark area 300 is comprised of film region 340. In one embodiment, film region 340 may comprise an oxide film, such as silicon oxide, or a nitride film, such as silicon nitride. A plurality of alignment marks (horizontal bar 342, vertical bar 344, diagonal bar 346, and cross 348) are shown within film region 340. Horizontal bar 342, vertical bar 344, and diagonal bar 346 are all of rectangle shapes. Other alignment shapes, such as ring 345 or triangle 347 may also be used. Other shapes may also be used. Each alignment mark is preferably comprised of silicon. The silicon alignment mark surrounded by the film (nitride or oxide) region provides for good contrast with the OCT tomograms. In practice, one or more such alignment marks may be present within a film region. Other shapes of alignment mark are contemplated and within the scope of the present invention.

Figure 3B:
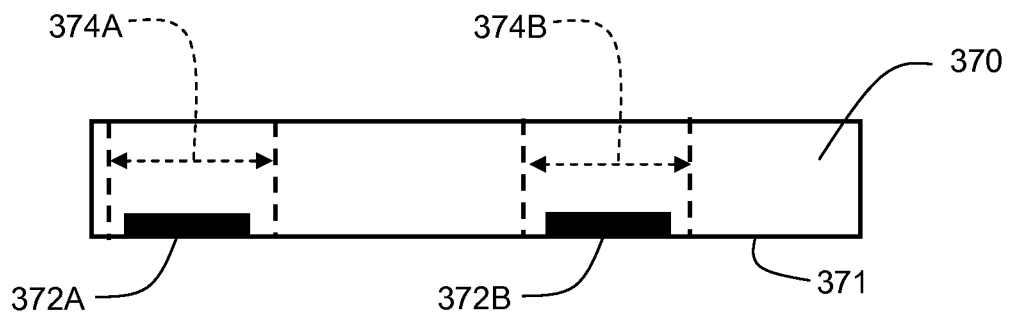

FIG. 3B shows a side view of alignment marks in accordance with an embodiment of the present invention. As shown in FIG. 3B, wafer 370 comprises alignment marks 372A and 372B, along the bottom 371 of wafer 370. For optimal OCT results, it is preferable to define a non-metal zone within the wafer above each alignment mark. Non-metal zone 374A is above alignment mark 372A, and non-metal zone 374B is above alignment mark 372B. Each non-metal zone extends throughout the depth of the wafer; hence there is no metal above the alignment marks. By avoiding the placement of metal (e.g. lines and vias) above the alignment mark, the risk of erroneous OCT readings due to obstructions or diffractions is reduced. In some cases, alignment marks may be placed in unused areas of the wafer, such as the periphery or kerf areas.

Figure 3C:
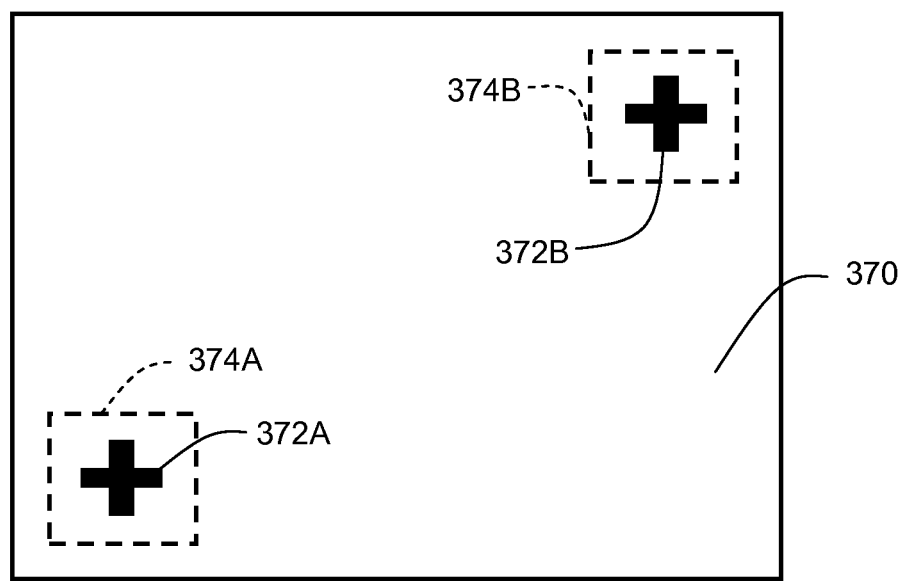

FIG. 3C shows a top-down view of the alignment marks of FIG. 3B, indicating the non-metal zones.

Figure 3D:
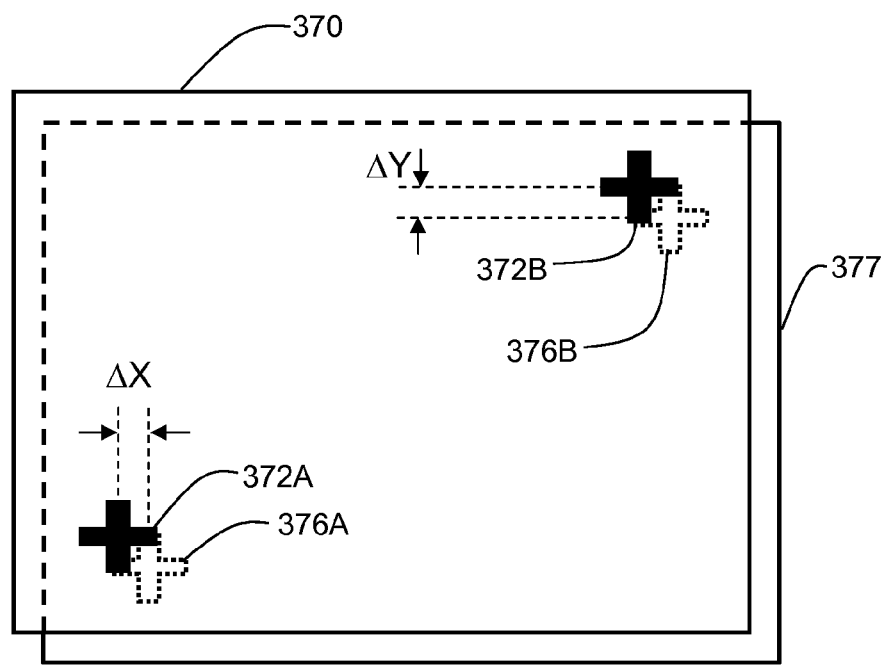

FIG. 3D is a top down view of two wafers, indicating correction data. Upper wafer 370 comprises alignment marks 372A and 372B. Lower wafer 377 comprises corresponding alignment marks 376A and 376B. The difference in X position (indicated as $\Delta X$), and the difference in Y position (indicated as $\Delta Y$) are supplied to wafer stage control (218 of FIG. 2) to make adjustments to the relative position of upper wafer 370 and lower wafer 377 such that $\Delta X$ and $\Delta Y$ are within predetermined limits. In one embodiment, the predetermined limit is 100 nanometers.

Figure 4:
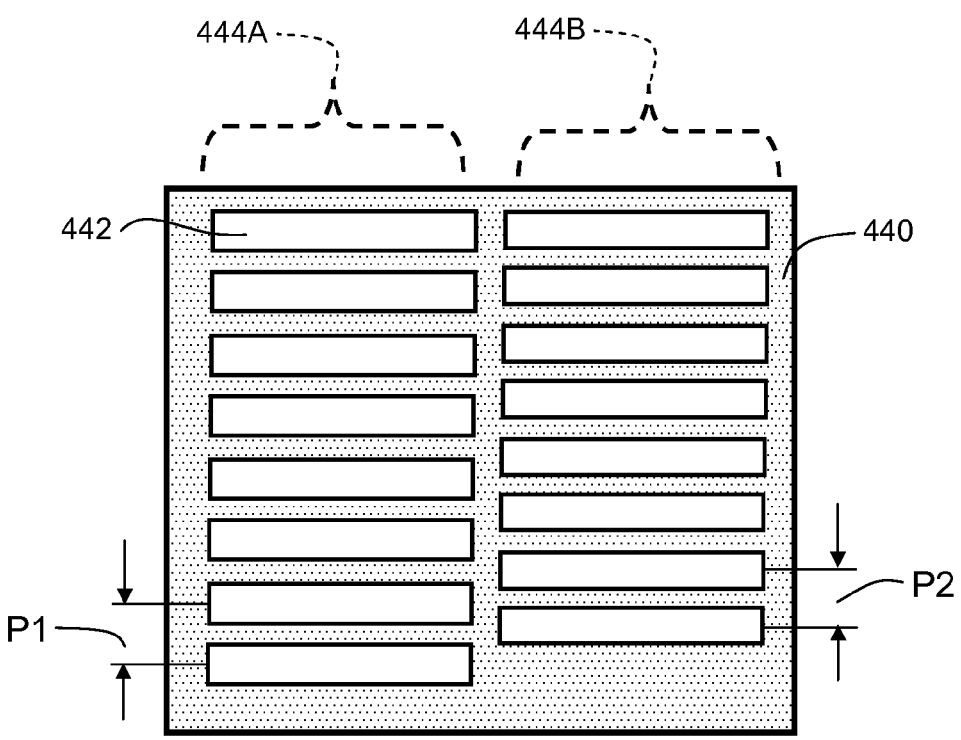

FIG. 4 shows a top-down view of alignment marks in accordance with another embodiment of the present invention. In this embodiment, film region 440 comprises two sets of parallel marks (each mark is indicated generally with reference 442). Set 444A comprises marks spaced apart with pitch P1. Set 444B comprises marks of similar size to those of set 444A, but spaced apart with pitch P2. Pitch P2 is some fraction of pitch P1. In one embodiment, P2=0.9(P1). Similar to the other marks previously described, film region 440 is preferably comprised of a nitride or oxide, and alignment marks 442 are comprised of silicon. The wafers are aligned when all the marks from set 444A and set 444B are aligned on an upper wafer and a lower wafer. In this way, the precision of the alignment is improved over the use of a single mark.

Figure 5:
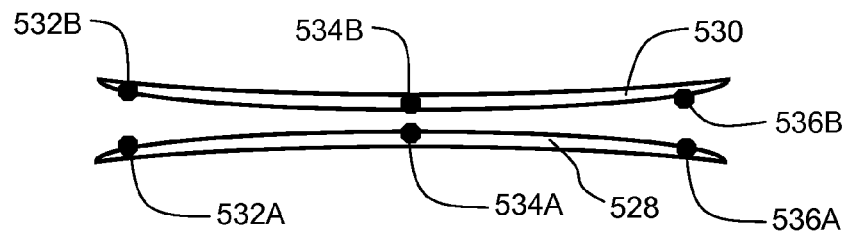

FIG. 5 shows alignment marks on wafers having warpage. While in theory, wafers are planar, in practice, the wafer may be slightly non-planar. When multiple alignment marks are distributed throughout a wafer, the OCT system can determine the 3D contour of the wafer.

In FIG. 5, upper wafer 530 comprises alignment marks 532B, 534B, and 536B. Lower wafer 528 comprises alignment marks 532A, 534A, and 536A. By analyzing the 3D contour of the wafer, the wafer alignment system then may provide the capability to determine a better orientation for the wafers (e.g. via a best-fit technique) or may indicate a failure, and reject a wafer that has excessive warpage.

Figure 5B:
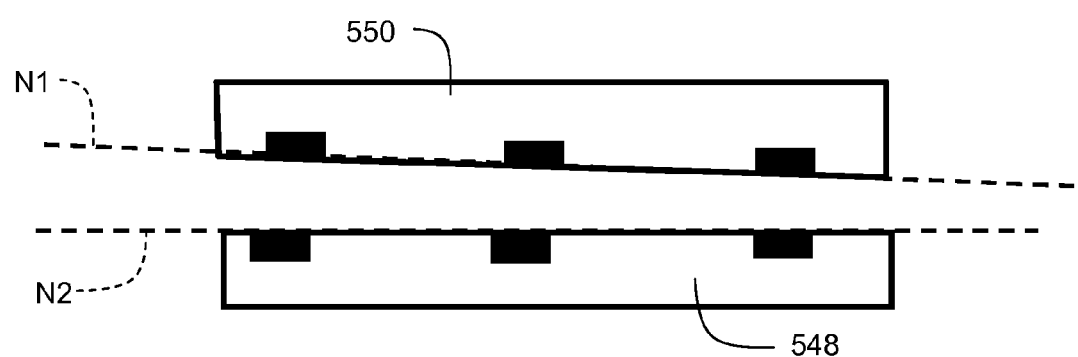

FIG. 5B shows an additional embodiment, in which, by considering at least 3 alignment marks on each wafer, a best-fit plane (N1, N2) for each wafer (550, 548) is computed. The wafer stage control (see 218 of FIG. 2) orients the upper wafer 550 such that its best-fit plane (N1) is parallel to the best-fit plane (N2) of lower wafer 548. FIG. 5B shows the upper wafer prior to adjustment to make plane N1 and N2 parallel.

Figure 6:
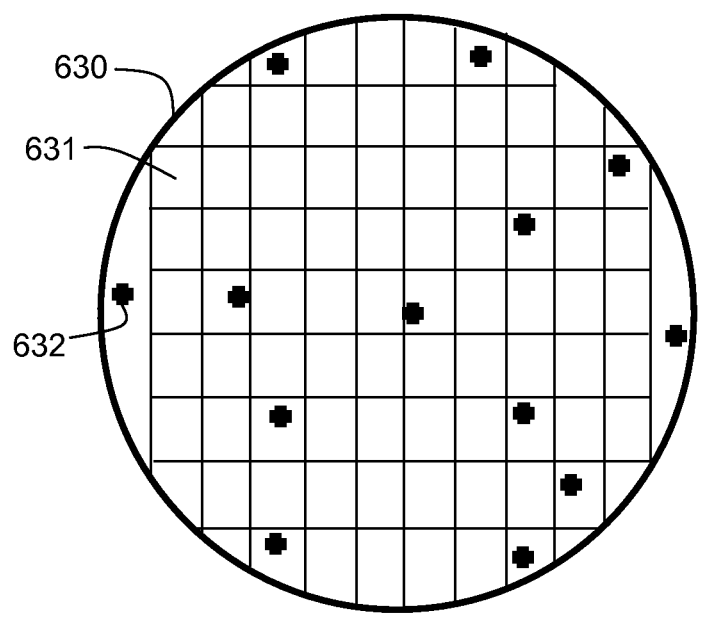

FIG. 6 shows a top-down view of multiple alignment marks (indicated generally as 632) on a wafer 630, which contains multiple chips (die) 631. The OCT system computes an X, Y, and Z coordinate for each alignment mark. Ideally, each alignment mark should have the same Z coordinate (if the wafer is truly planar). In practice the wafer may have a certain amount of warpage or non-planarity. By considering the true contour of the wafer, an improved positioning of the wafers may be achieved. By measuring the Z dimension of at least four alignment marks, a measure of planarity can be computed by determining the residual (best-fit error) to a plane. If the best-fit residual exceeds a predetermined value, the wafer may be rejected as being excessively warped.

Figure 7:
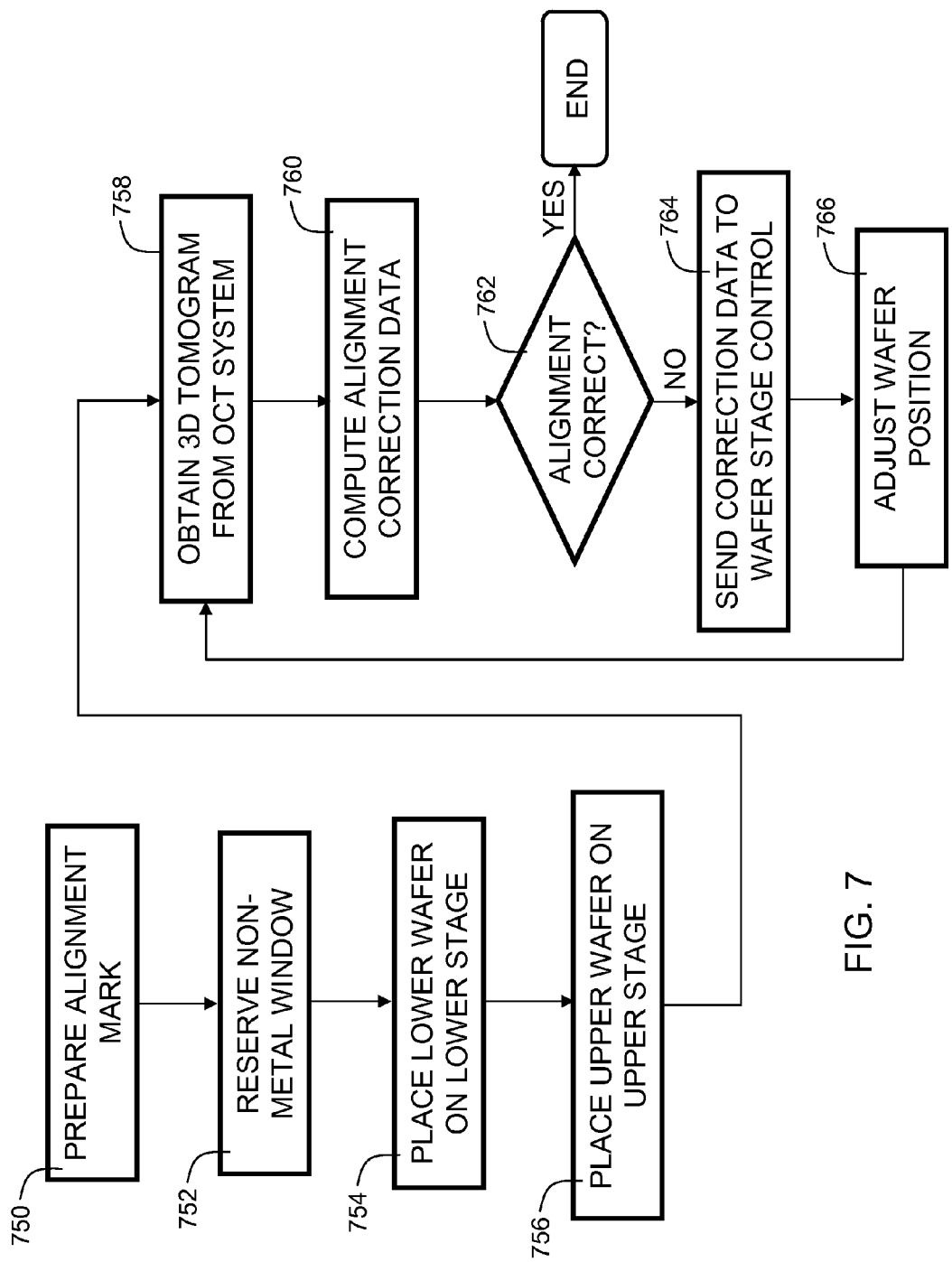

FIG. 7 is a flowchart indicating process steps for an embodiment of the present invention. In process step 750, the alignment marks are prepared by forming a pattern of silicon within a film region (see FIG. 3). In process step 752, a non-metal window is reserved within the wafer for each alignment mark (see 374A and 374B of FIGS. 3B and 3C). In process step 754, the lower wafer is placed on the lower stage of wafer stage control (see 228 of FIG. 2).). In process step 756, the upper wafer is placed on the upper stage of wafer stage control (see 230 of FIG. 2). In process step 758 a 3D tomogram is obtained from the OCT system. In process step 760, alignment correction data is computed. This step may be performed by computer system 216. In process step 762 a check is made to determine if the alignment of the upper and lower wafers is correct. For example, in one embodiment, a check is made to determine if the alignment marks of the upper wafer are within a predetermined distance of the corresponding marks of the lower wafer. In one embodiment, the predetermined distance is in the range of 100 nanometers to about 1 micrometer. If the alignment is considered correct, then the process ends. If the alignment is not correct, the correction data is sent to the wafer stage control (see 218 of FIG. 2) in process step 764. The wafer position is adjusted in process step 766. Depending on the embodiment, either the upper wafer, lower wafer, or both, may be adjusted in response to the correction data determined in process step 760. Process steps 758-766 may be repeated numerous times in an iterative manner until the alignment is correct. Optionally, the number of iterations can be capped, such that after a predetermined number of iterations, an error condition is signaled if the wafers are still not aligned after that number of attempts.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A system for performing alignment of two wafers, comprising:
    an optical coherence tomography system; and
    a wafer alignment system;
    wherein the wafer alignment system is configured and disposed to control the relative position of a first wafer and a second wafer, and wherein the optical coherence tomography system is configured and disposed to compute three-dimensional coordinate data for a plurality of alignment marks on the first wafer and second wafer; and send said coordinate data to the wafer alignment system.

2. The system of claim 1, wherein the optical coherence tomography system comprises a light source that emits light having a wavelength ranging between 1.1 micrometers and 1.7 micrometers.

3. The system of claim 1, wherein each of the plurality of alignment marks comprises a silicon region surrounded by a film region.

4. The system of claim 3, wherein the film region comprises an oxide region.

5. The system of claim 3, wherein the film region comprises a nitride region.

6. The system of claim 3, wherein the silicon region has a ring shape.

7. The system of claim 3, wherein the silicon region has a rectangle shape.

8. The system of claim 3, wherein the silicon region has a cross shape.

9. The system of claim 3, wherein each of the plurality of alignment marks is positioned within a non-metal zone, and wherein the non-metal zone extends throughout the depth of the wafer.

10. The system of claim 3, wherein the plurality of alignment marks comprises a first set of parallel marks having a first pitch, and a second set of parallel marks having a second pitch, wherein the second pitch is smaller than the first pitch.

11. A system for performing alignment of two wafers, comprising:
    a light source configured to emit light having a wavelength ranging between 1.1 micrometers and 1.7 micrometers;
    a collimating lens configured and disposed to collimate light from said light source;
    a beam splitter configured and disposed to split the light from said collimating lens into a reference path and a target path;
    an objective lens configured and disposed to focus light of the target path onto a set of wafers comprising a first wafer and a second wafer;
    a detector configured and disposed to receive light from the reference path and the target path;
    a computer system configured and disposed to compute a three-dimensional tomogram of the set of wafers and compute three-dimensional correction data; and
    a wafer stage control configured and disposed to receive correction data from the computer system and adjust the relative position of the first wafer and second wafer in response to said correction data.

12. A method for performing alignment of two wafers, the two wafers comprising a first wafer and a second wafer, comprising:
    obtaining a three-dimensional tomogram of the two wafers;

computing three-dimensional alignment correction data;
sending the alignment correction data to a wafer stage control; and
adjusting the relative position of the two wafers with the wafer stage control in response to receiving said alignment data.

13. The method of claim 12, wherein computing alignment correction data comprises:
identifying a first alignment mark on the first wafer and recording its location in X, Y, and Z dimensions;
identifying a second alignment mark on the second wafer and recording its location in X, Y, and Z dimensions; and
computing the difference between the first alignment mark and the second alignment mark in X, Y, and Z dimensions.

14. The method of claim 13, further comprising:
identifying at least three alignment marks on the first wafer and recording their locations in X, Y, and Z dimensions;
identifying at least three alignment marks on the second wafer and recording their locations in X, Y, and Z dimensions;
computing the best-fit plane for the alignment marks on the first wafer; and
computing the best-fit plane for the alignment marks on the second wafer.

15. The method of claim 14, further comprising adjusting the relative orientations of the first wafer so that the best fit plane for the alignment marks on the first wafer is parallel to the best-fit plane for the alignment marks on the second wafer.

16. The method of claim 13, further comprising:
identifying at least four alignment marks on the first wafer and recording their locations in X, Y, and Z dimensions;
identifying at least four alignment marks on the second wafer and recording their locations in X, Y, and Z dimensions;
computing a best-fit residual to a plane for the four alignment marks on the first wafer;
computing a best-fit residual to a plane for the four alignment marks on the second wafer; and
rejecting the first wafer or the second wafer in response to a corresponding best-fit residual that exceeds a predetermined value.

17. The method of claim 13, wherein identifying a first alignment mark and identifying a second alignment mark comprises identifying a horizontal bar.

18. The method of claim 13, wherein identifying a first alignment mark and identifying a second alignment mark comprises identifying a vertical bar.

19. The method of claim 13, wherein identifying a first alignment mark and identifying a second alignment mark comprises identifying a diagonal bar.

20. The method of claim 12, further comprising:
identifying a first set of parallel marks having a first pitch; and
identifying a second set of parallel marks having a second pitch, wherein the second pitch is smaller than the first pitch.

* * * * *